United States Patent [19]

Ingle

[11] Patent Number: 4,475,681
[45] Date of Patent: Oct. 9, 1984

[54] BONDER APPARATUS

[75] Inventor: Lloyd D. Ingle, Valley Center, Calif.

[73] Assignee: The Micromanipulator Co., Inc., Carson City, Nev.

[21] Appl. No.: 381,174

[22] Filed: May 24, 1982

[51] Int. Cl.³ .................................................. B23K 37/02
[52] U.S. Cl. ............................... 228/4.5; 219/56.21; 228/179
[58] Field of Search ................ 219/56.1, 56.21, 56.22, 219/110; 228/4.5, 11, 102, 110, 111, 179; 242/190, 75, 75.43

[56] References Cited

U.S. PATENT DOCUMENTS

| 3,626,590 | 12/1971 | Miller | 228/179 |
| 3,727,822 | 4/1973 | Umbaugh | 219/110 |
| 3,775,579 | 11/1973 | Burghart et al. | 219/56.1 |
| 3,822,465 | 7/1974 | Frankort et al. | 228/111 |
| 4,069,961 | 1/1978 | Nicklaus et al. | 228/4.5 |
| 4,205,773 | 6/1980 | Nicklaus | 219/56.21 |
| 4,340,166 | 7/1982 | Bilane et al. | 228/179 |
| 4,389,951 | 6/1983 | von Hagen | 242/75 |

Primary Examiner—C. C. Shaw
Attorney, Agent, or Firm—Fitch, Even, Tabin & Flannery

[57] ABSTRACT

A wire bonder apparatus for use in connecting a conductor wire to a conductive element on a work piece, such as a microelectronic chip or wafer. The bonder apparatus includes a work piece support station adapted to support a work piece observable through a microscope viewing arrangement, and a bonding head having a support arm on which is mounted a bonding tool and selectively movable wire clamping arms adapted to incrementally feed a bonding wire to the bonding tool. The support arm is caused to undergo a ramped movement so as to effect a predetermined progressively increasing contact force between the bonding tool and the work piece. In one embodiment, the clamping arms are adapted for cooperation with actuator means so as to effect incremental stepped arcuate movement of clamping fingers along the path traversed by the conductor wire whereby to linealy advance the bonding wire when gripped by the clamping fingers. Bonding wire supply means are selectively operable so as to maintain a desired tension in the bonding wire.

5 Claims, 17 Drawing Figures

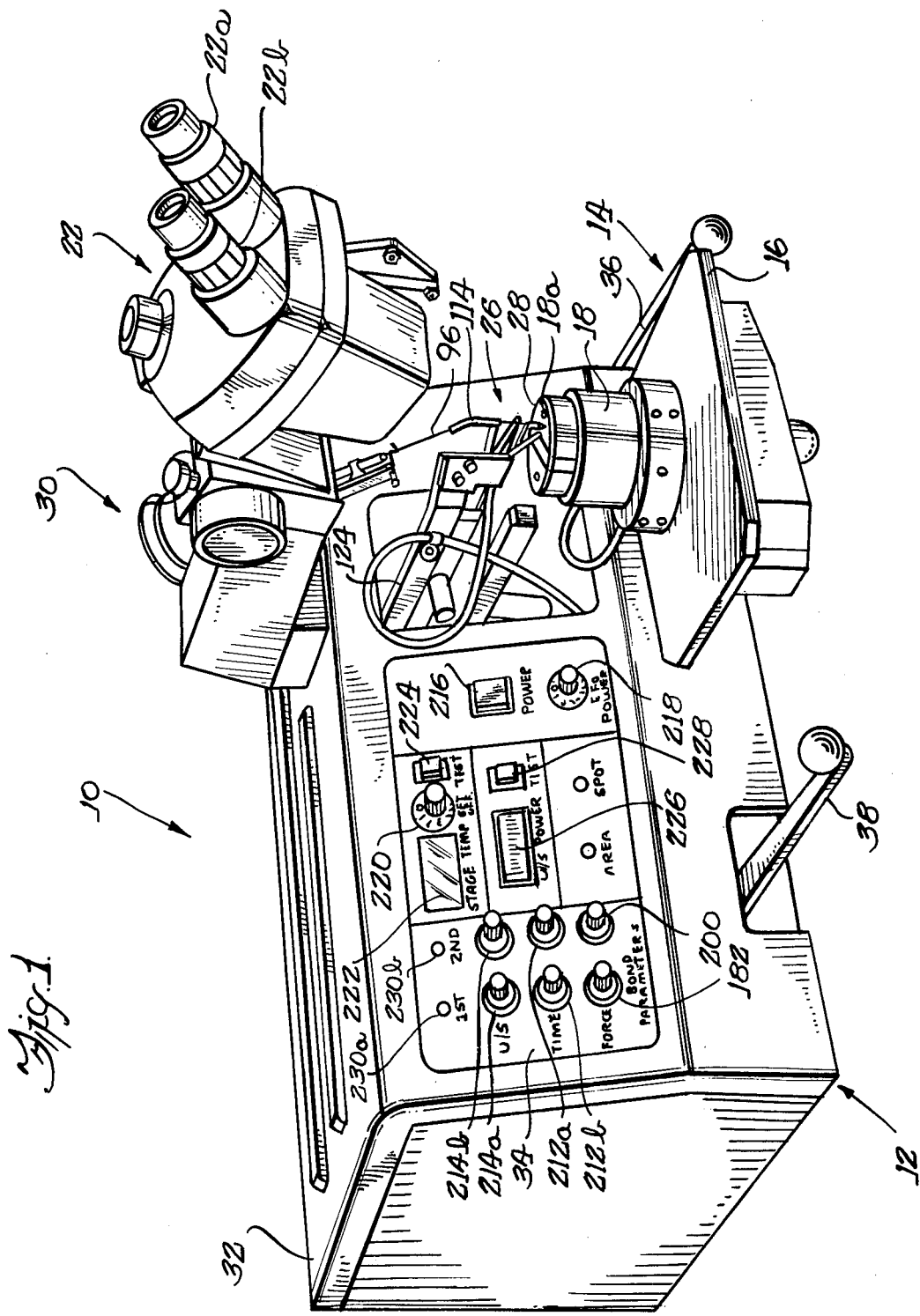

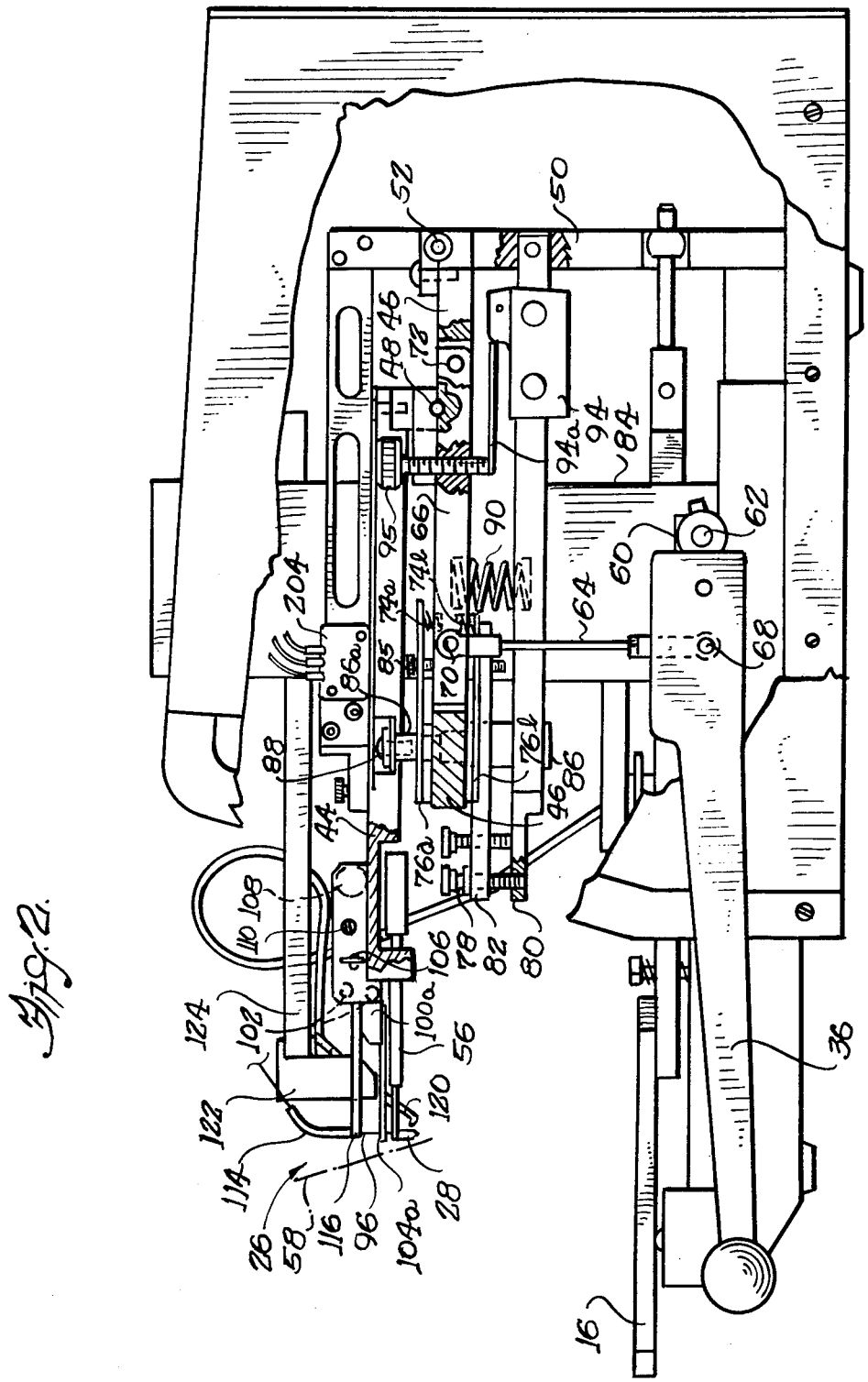

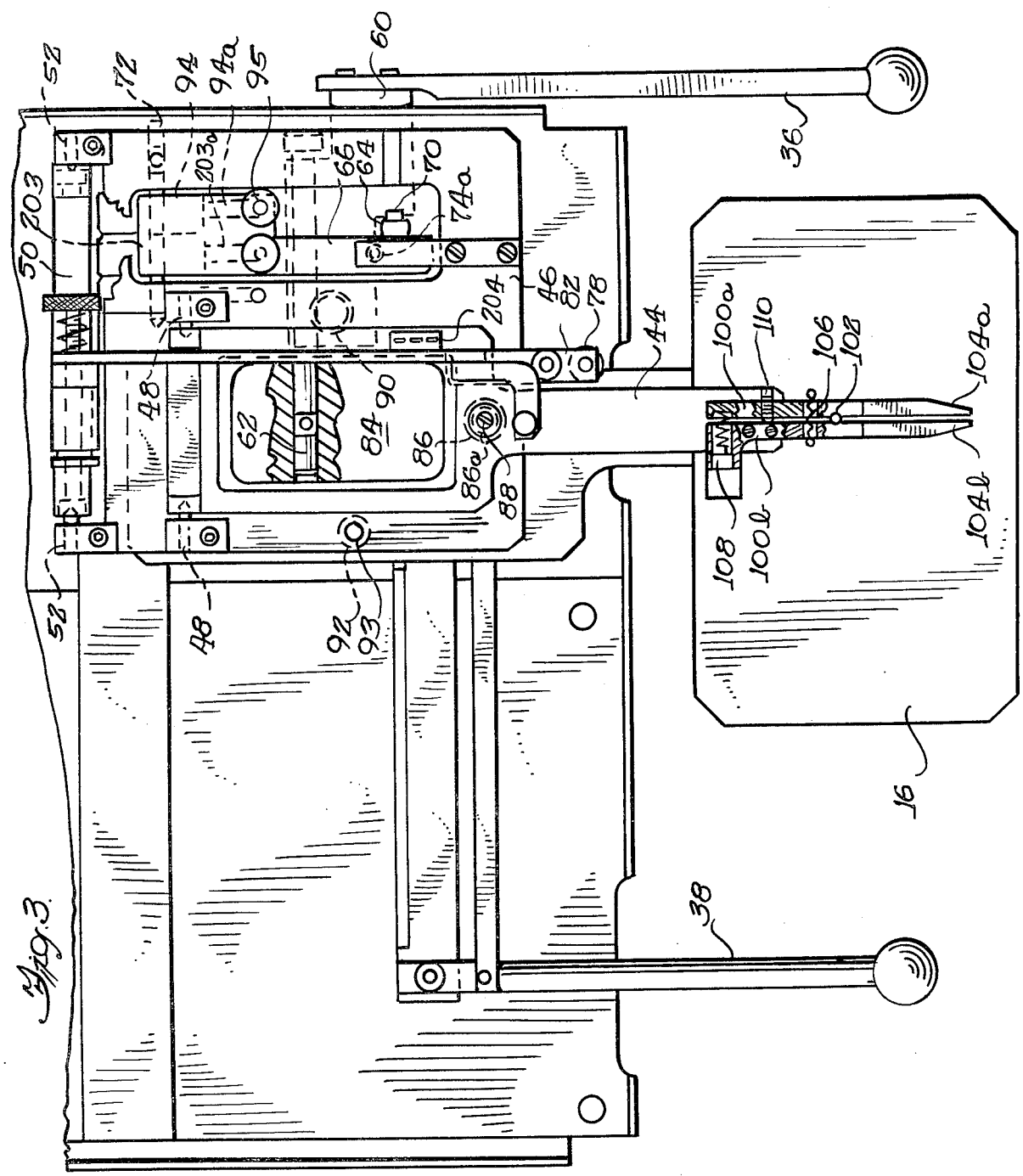

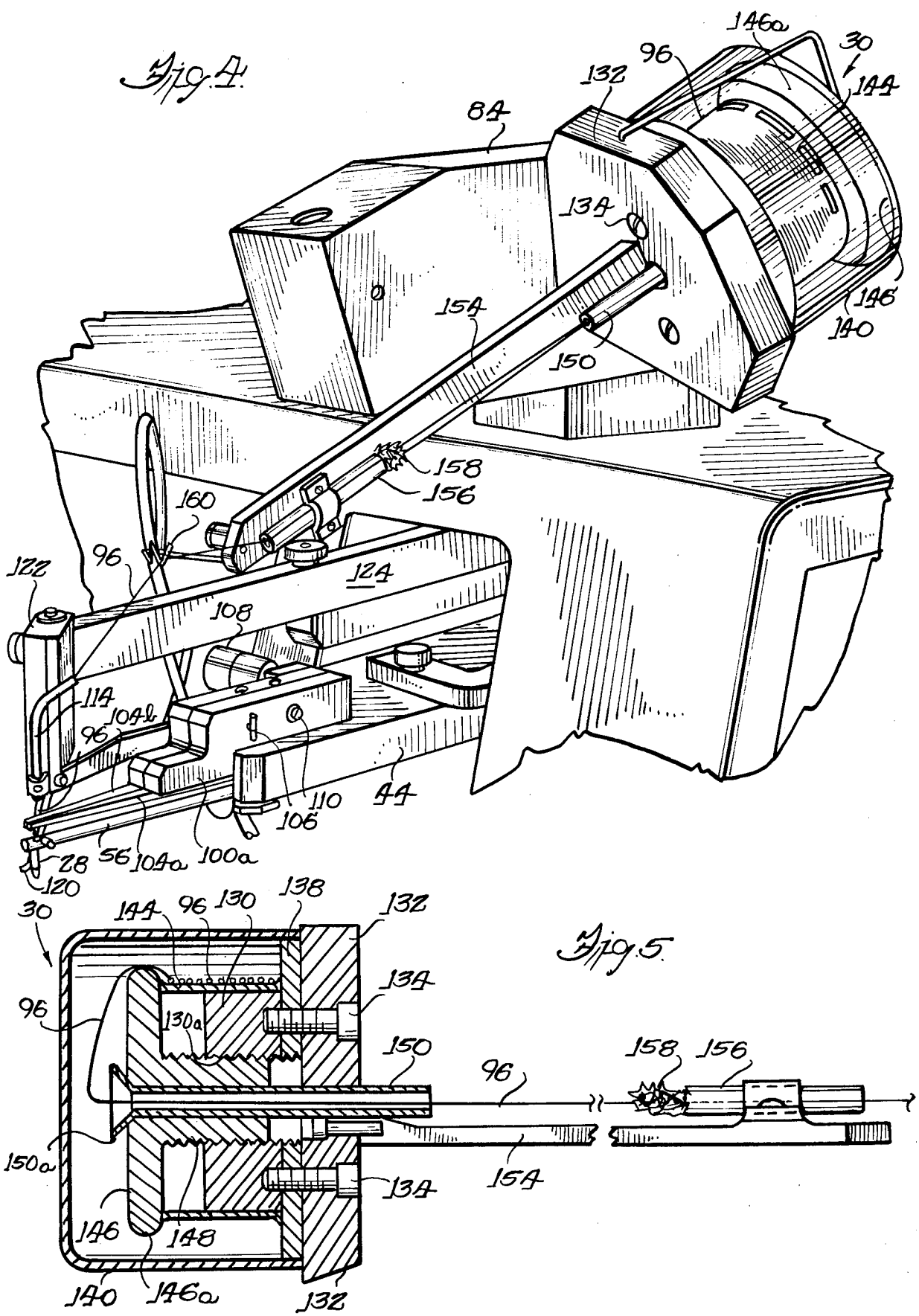

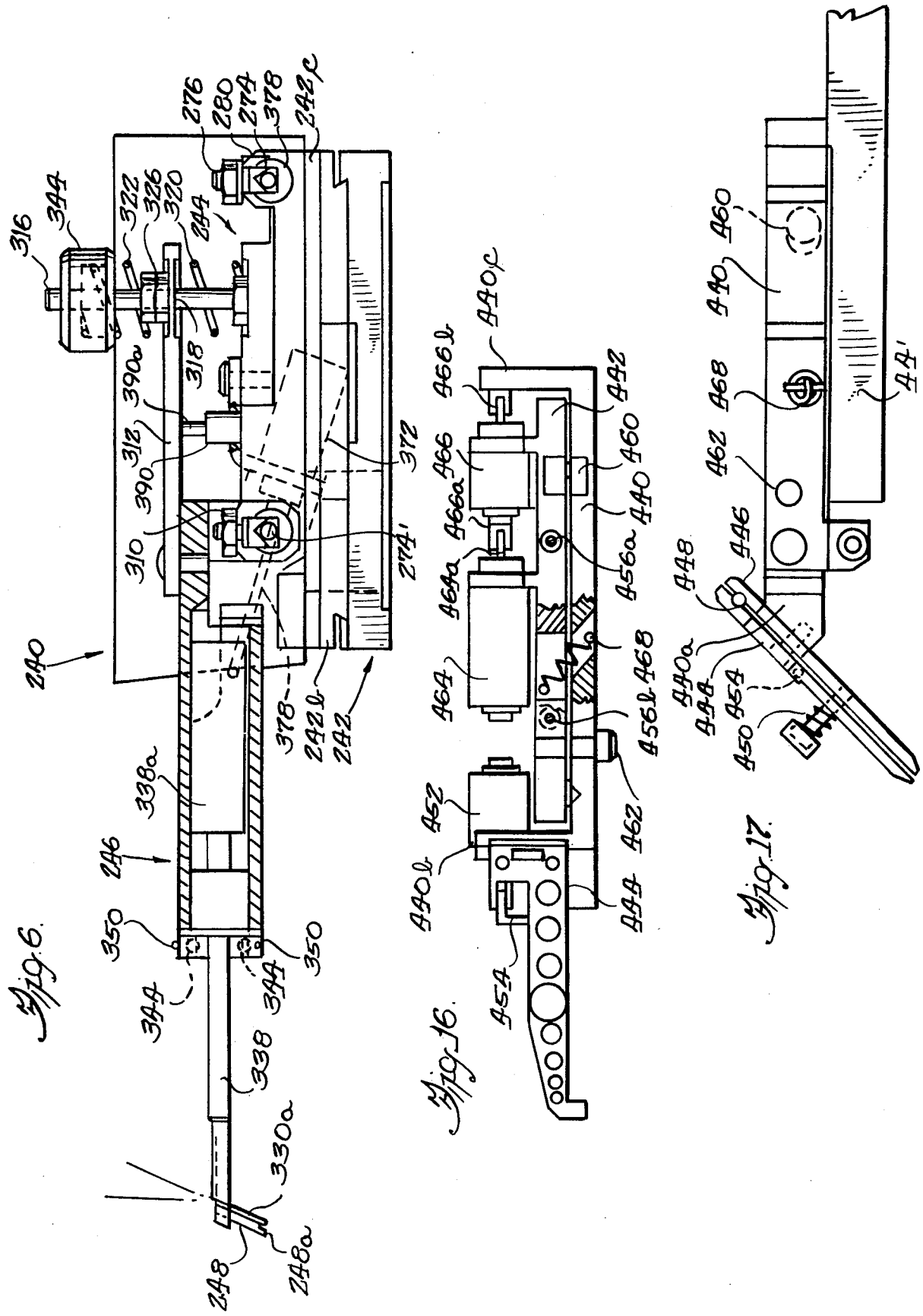

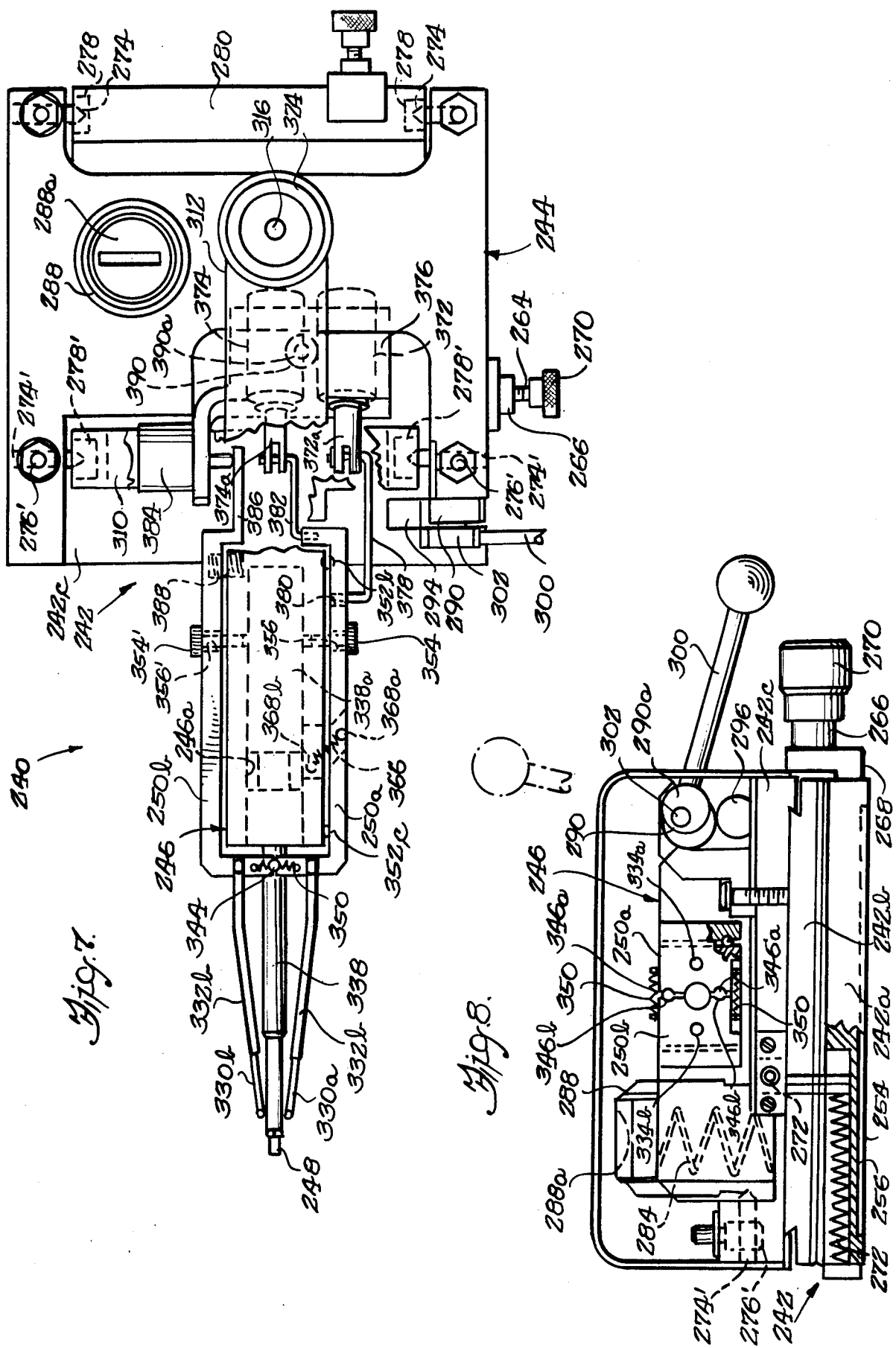

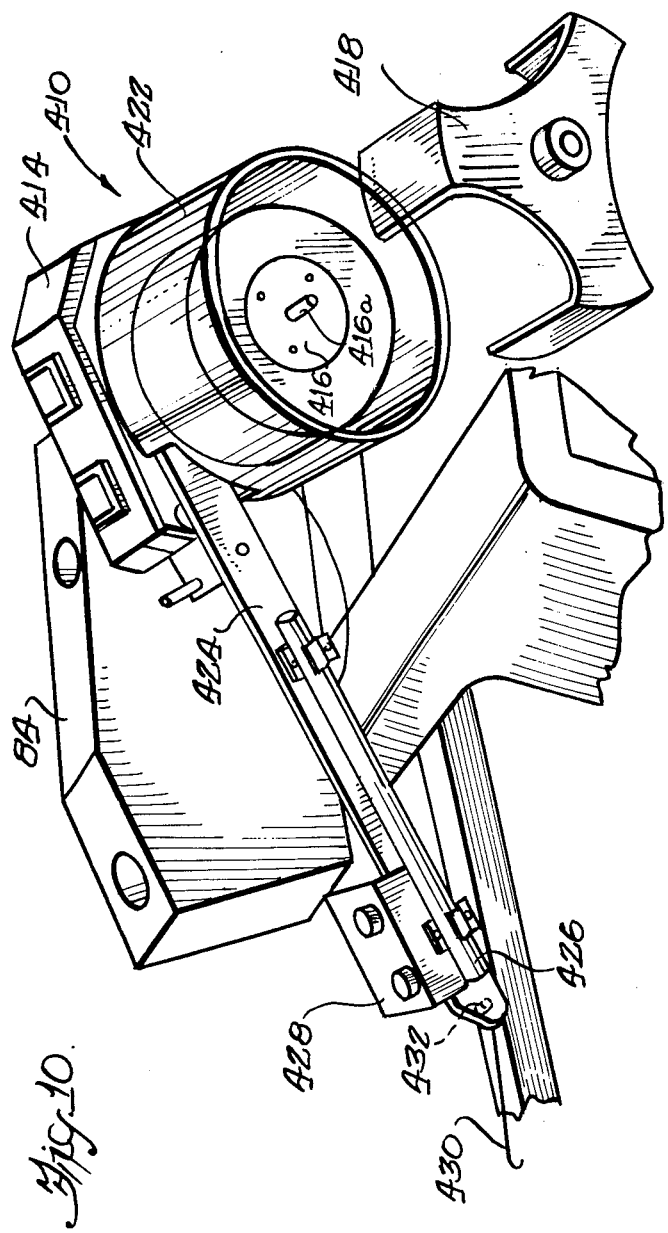
Fig. 10.
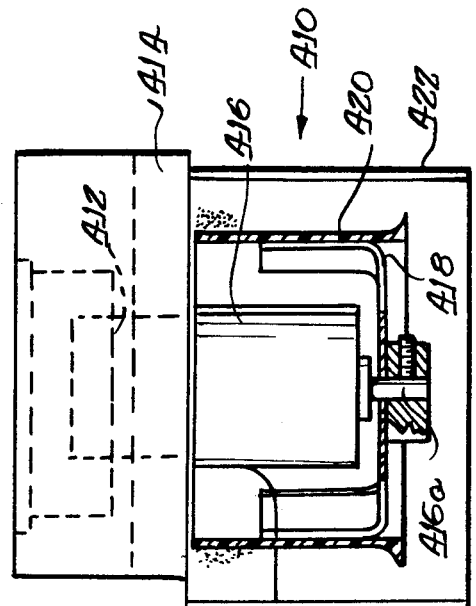
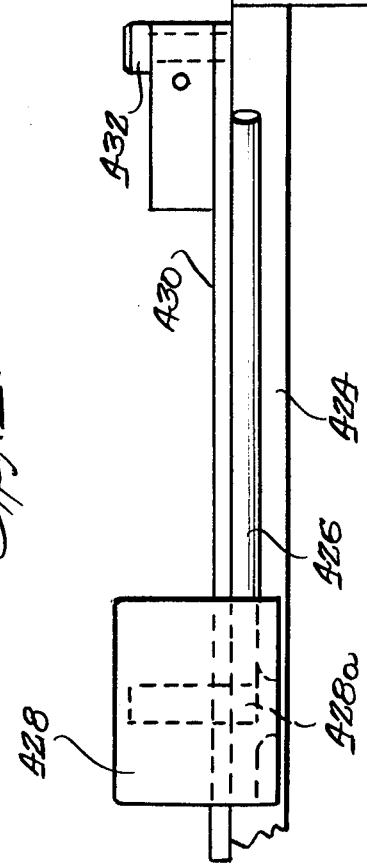
Fig. 11.

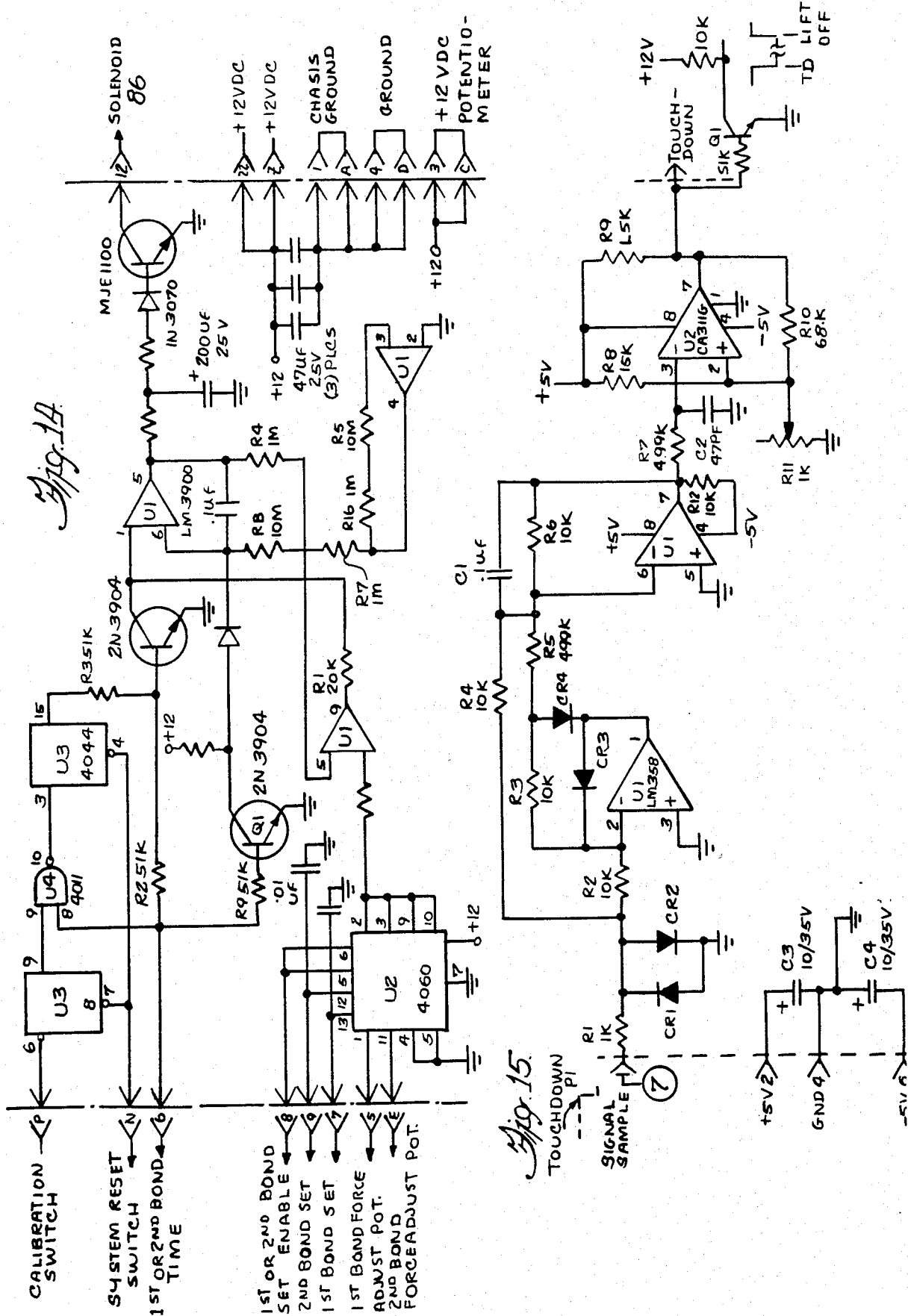

BONDER APPARATUS

BACKGROUND OF THE INVENTION

The present invention relates generally to bonding apparatus, and more particularly to novel bonding apparatus of the type enabling connection of a conductor wire to a conductive element on a work piece such as a microelectronic chip and the like.

In the design and manufacture of integrated circuit packages, such as employed in microprocessor devices, it is often desirable during the research and development stage to analyze or test the circuits on a semiconductor chip. The testing and analysis often entails conductive interconnection between two or more conductive elements on the semiconductor chip or alternatively, connecting a conductive element on the chip to an external circuit. The ability to conductively interconnect conductive elements within the boundary of a single semiconductor chip, alternatively termed a microelectronic chip, is desirable to facilitate development of new or alternate microcircuits without having to make an entirely new chip. Intraconnection of conductive elements within a single chip boundary also facilitates failure analysis of chips by enabling a bypass of a suspected defective area, thereby localizing the problem area.

Connection of circuits or conductive elements on semiconductor chips to each other or to external conductors, such as on a carrier board or lead frame, is conventionally accomplished by wire bonding. Wire bonding is basically a welding operation in which a weldment is formed between a conductive bonding wire or ribbon and a metallic conductive element or pad on the microelectronic chip or wafer. The weldment is formed when the two metal surfaces are brought into intimate molecular contact to enable short range interatomic attractive forces to become operative. This generally requires that both the conductive wire and the conductive element on the chip must experience some degree of plastic deformation in order to achieve a good bond.

The known wire bonder devices accomplish bonding generally in accordance with one of three basic techniques:
thermocompression ball bonding, which employs a flame or spark to melt the end of a conductor wire which forms a ball due to surface tension whereafter the ball is brought down onto a conductive element or pad on the chip and attached thereto by means of heat and pressure applied by the capillary tool through which the wire passes; thermosonic ball bonding, which is generally similar to thermocompression ball bonding except that ultrasonic energy is applied through the bonding tool and less heat is applied to the chip; and ultrasonic wedged bonding which employs a combination of pressure and ultrasonic energy applied by a wedge type bonding tool to produce a bond between the conductive wire and the conductive element on the chip.

The known wire bonders exhibit substantial drawbacks or limitations which significantly limit their application in microelectronic chip design and development, as well as use with chips having high circuit density which require very fine conductor wire in the bonding operation. For example, the known bonder devices do not readily lend themselves to use in making circuit interconnects within the boundaries of a single wafer or chip. Moreover, the known bonder devices do not facilitate use with high power microscopes having generally vertical sight lines such as are highly desirable with high density chips to reduce paralax.

SUMMARY OF THE INVENTION

In accordance with the present invention, a bonder apparatus is provided for use in connecting a conductor wire to a conductive element on a work piece, such as a microelectronic chip or wafer. The bonder apparatus includes a base frame which defines a work station adapted to support a work piece observable through a microscope viewing arrangement. A bonding head includes a support arm on which is mounted a bonding tool adapted to receive a continuous length of conductor wire from a wire supply reel under controlled tension, the bonding head having selectively movable wire clamping arms adapted to incrementally feed the conductor to the bonding tool. The support arm is manually movable to a first search position whereafter the support arm is caused to undergo a predetermined ramped movement in a manner to effect a predetermined progressively increasing contact force between a contact end of the conductor wire and the work piece. In one embodiment, the clamping arms are adapted for cooperation with actuator means so as to effect movement of clamping fingers along the path traversed by the conductor wire as it is guided through the bonding tool whereby to linearly advance the conductive wire when gripped by the clamping fingers.

Accordinhgly, a general object of the present invention is to provide a novel bonder apparatus of the type enabling connection of a conductor wire to a conductive element on a work piece such as a microelectronic chip and the like.

A more particular object of the present invention is to provide a novel bonder apparatus which finds particular application in interconnecting two conductive points within the boundaries of the single microelectronic chip or wafer.

A feature of the bonder apparatus in accordance with the invention lies in the provision of the means for effecting a predetermined ramped contact force between the conductor wire and a work piece so that bonding is effected with very low impact force, thereby eliminating the problems of chip cratering or metalization damage and tool bounce as experienced with the prior art devices.

Another feature of the bonding apparatus in accordance with the present invention lies in the provision of a bonding head having a support arm carrying clamping arms which have clamping fingers thereon adapted to selectively grip the conductor wire proximate the bonding tool, the clamping arms being moveable in a generally arcuate path relative to the associated support arm so as to effect generally linear movement of the conductor wire along its normal predetermined path guided by the bonding tool during gripping thereof, the bonding head having actuating means cooperative with the clamping arms to effect a predetermined sequential and incremental movement of the clamping arms during a bonding operation.

Still another feature of the bonder apparatus in accordance with the present invention lies in the provision of a bonding head which has a relatively low profile and small size enabling it to be readily attached as a modular unit to an analytical probe device or the like.

Another feature of the bonding apparatus in accordance with the present invention lies in the provision of a motorized conductor wire feeder having conductor wire tension means associated therewith so as to control the feed and thereby the tension in the conductor wire fed to the bonding tool.

Another feature of the bonding apparatus in accordance with the present invention lies in the provision of a novel manner of mounting the bonding head on its support arm so as not to obstruct viewing of the work piece through the vertical sight line of an associated microscope viewing arrangement.

Still another feature of the bonding apparatus in accordance with the invention lies in the provision of a control circuit adapted to provide an audio signal upon initiation of a conductor and provide a second audio signal indicating termination of a predetermined bonding period.

Further objects, advantages and features of the invention, together with the organization and manner of operation thereof, will become apparent from the following detailed description of the invention when taken in conjunction with the accompanying drawings wherein like reference numerals designate like elements throughout the several views.

BRIEF DESCRIPTION OF THE DRAWINGS

FIG. 1 is a prospective view of a bonder apparatus constructed in accordance with one embodiment of the present invention;

FIG. 2 is a side elevational view of the bonder apparatus of FIG. 1 but with the viewing microscope, work holder and conductor wire supply removed and with portions broken away for purposes of clarity;

FIG. 3 is a plan view of the portion of the bonder apparatus illustrated in FIG. 2, portions being broken away for purposes of clarity;

FIG. 4 is a fragmentary perspective view illustratinfg a portion of the bonder head employed in the apparatus of FIG. 1 in operative relation with one embodiment of a conductor wire supply arrangement in accordance with the invention;

FIG. 5 is a plan view of the conductor wire feeder illustrated in FIG. 4, portions being broken away for clarity;

FIG. 6 is a side elevational view of a bonding head constructed in accordance with an alternative embodiment of the invention, portions being broken away for purposes of clarity;

FIG. 7 is a plan view of the bonding head illustrated in FIG. 8 but with the cover removed;

FIG. 8 is a front elevational view of the bonding head illustrated in FIG. 7 but with the wire clamping fingers and transducer removed;

FIG. 10 is a fragmentary perspective view illustrating an alternative conductor wire supply arrangement in accordance with the invention;

FIG. 11 is a plan view of the conductor wire supply arrangement illustrated in FIG. 10;

FIG. 14 is a circuit diagram of the circuit for effecting a ramped application of bonding force by the bonder apparatus in accordance with the present invention;

FIG. 15 is a circuit diagram of a touchdown sensor circuit employed with the bonding head illustrated in FIGS. 6–9;

FIG. 16 is a fragmentary plan view of a clamping arm arrangement in accordance with an alternative embodiment of the invention, with portions broken away for clarity; and FIG. 17 is a fragmentary side elevational view of the clamping arm arrangement of FIG. 16.

DETAILED DESCRIPTION OF PREFERRED EMBODIMENTS

Figure 9:
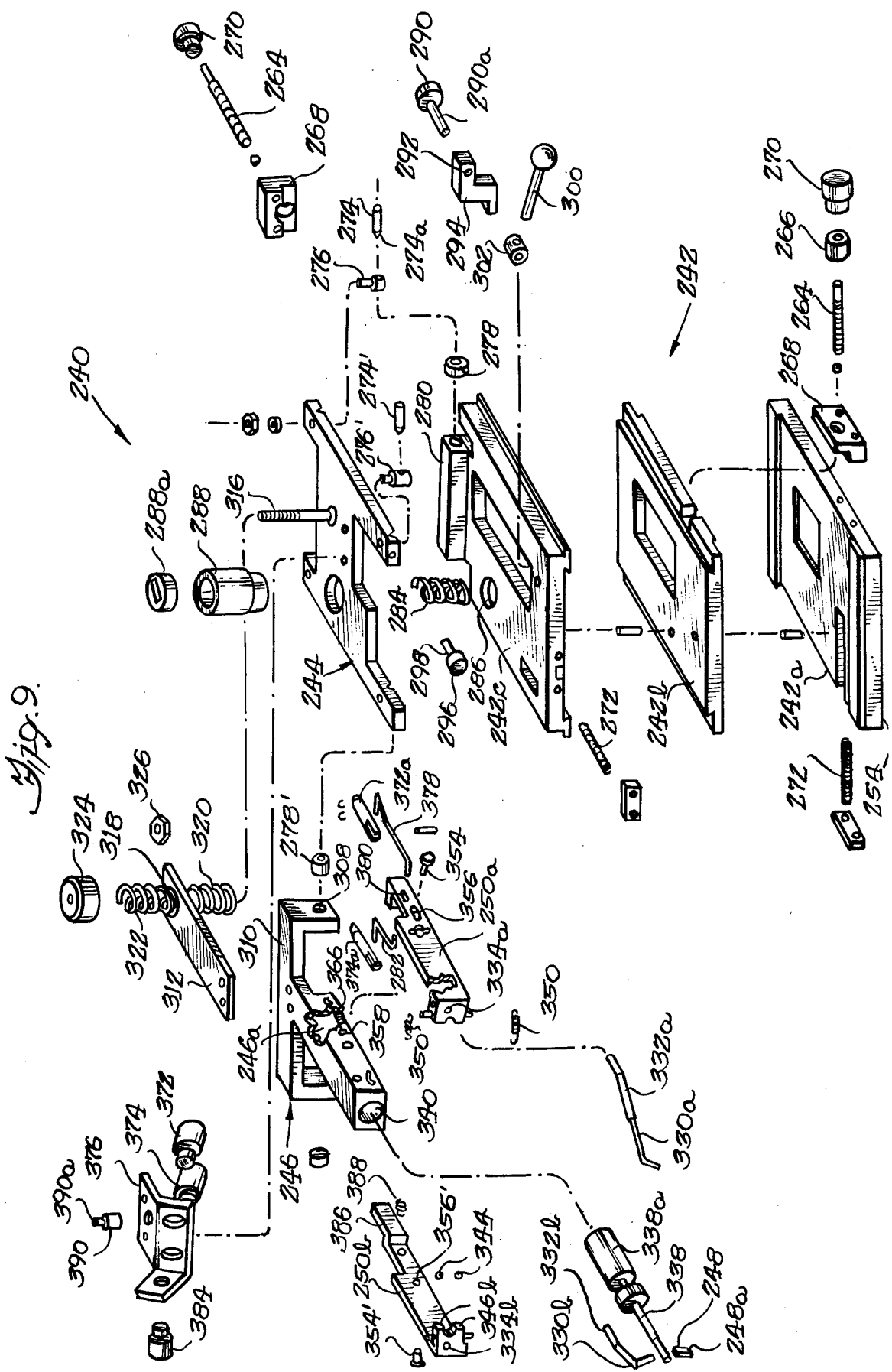
FIG. 9 is an exploded view perspective of the bonding head of FIG. 7.

Referring now to the drawings, and in particular to FIG. 1, a bonder apparatus constructed in accordance with one embodiment of the present invention is indicated generally at 10. The bonder apparatus 10 finds particular application in connecting a wire conductor or conductive ribbon to a conductive element on a work piece such as a microelectronic chip or wafer by either of the generally know principals of thermosonic bonding or thermocompression bonding, depending upon the type of bonding tool employed. The bonding apparatus 10 finds particular application in the bonding of very small diameter conductor wires, such as 5–12 microns, and facilitates conductive interconnection of two or more conductive elements within the boundary of a single microelectronic chip or wafer, alternatively termed a semiconductor chip, as used in microprocesser circuits and the like. The bonding apparatus 10 is capable of bonding conductive wires of substantially any ductile metal such as gold, copper, aluminum and platinum.

Very generally, the bonder apparatus 10 includes base frame means, indicated generally at 12, which defines a work station, indicated generally at 14, adapted to support a work piece. In the illustrated embodiment, the work station 14 includes a support plate 16 on which is supported a work piece holder 18 of known construction having an upper generally horizontal work piece support surface 18a adapted to support and selectively heat a work piece such as a microelectronic chip or wafer to which one or more electrically conductive wires are to be connected by bonding. The frame means 12 supports a work piece viewing arrangement in the form of microscope means, indicated generally at 22, which enables operator observation of the work piece during bonding through optical eyepieces 22a and 22b. The microscope means 22 is of conventional construction and, per se, forms no part of the present invention and need not be described in greater detail herein. If desired, a work piece illuminator (not shown) may be mounted so as to direct a beam of light onto the work piece.

Bonding head means, indicated generally at 26, is supported by the base frame means 12 in a manner to support a bonding tool 28 in overlying relation to the work piece support surface 18a and in generally underlying relation to the viewing lens of microscope means 22. The bonding head means 26 is adapted to receive and guide a continuous length conductor wire from conductor wire supply means, indicated generally at 30, which is supported by the frame means 12 generally above and rearwardly of the bonding tool 28 so as not to interfere with other conponents of the bonding apparatus. A cabinet or casing 32 is mounted on the frame means 12 in a manner to suitably enclose control circuitry and various other components of the bonder apparatus 10. The cabinet 32 has a front panel 34 on which various control knobs, switches, indicator meters and function indicating lights are mounted and displayed as will become more apparent hereinbelow. A first operating handle 36 facilitates manual control of movement of the vertical height of the bonding tool 28 relative to a work piece disposed on the work piece support surface 18a and is employed to lower the bonding tool to a search position and thereafter initiate bonding and subsequently control loop height when making an electrical interconnect on the work piece. A second operating handle or lever 38 extends forwardly from the cabinet 32 and facilitates operator controlled movement of the work station support plate 16 and work holder 18 in generally horizontal planes.

Turning now to a more detailed description of the bonding apparatus 10, and with reference to FIGS. 2, 3 and 4 taken in conjunction with FIG. 1, the bonding head means 26 includes a support arm 44 the major center axis of which defines its longitudinal axis and which supports the bonding tool 28 at a forwardmost end thereof. The support arm 44 is pivotally mounted adjacent its rearward end on a pivot plate 46 for pivotal movement relative to the pivot plate 46 about a pivot axis 48 transverse to the longitudinal axis of the support arm 44. The pivot plate 46 is in turn pivotally mounted adjacent its rearward end on an upstanding support plate 50 for pivotal movement about a transverse pivot axis 52 parallel to the pivot axis 48. The pivot axes 52 and 48 define, respectively, first and second transverse pivot axes for the support arm 44.

In the illustrated embodiment, the support arm 44 supports the bonding tool 28 through an ultrasonic transducer 56 which is of known design and is mounted on the support arm so as to extend forwardly in generally axially aligned relation with the longitudinal axis of the support arm to position the bonding tool in predetermined relation to a sight line, indicated at 58, of the microscope means 22. In the embodiment illustrated in FIGS. 1-3, the bonding tool 28 comprises a tubular capillary tool of conventional design and is mounted within a suitable transverse opening in the outer end of the transducer 56 and fixedly retained therein. It will be appreciated that, if desired, the capillary bonding tool 28 may be replaced with a wedge type bonding tool having a relatively planar lower bonding surface and having an opening therethrough adapted to receive and guide a continuous length of conductive wire so as to establish a connector end of the wire underlying the bonding surface for bonding to a conductive element on a work piece.

The support arm 44 is pivotally movable about the transverse pivot axis 52 between a first position wherein the bonding tool 28 and associated conductor wire are spaced a predetermined distance from a work piece when supported on the work piece support 18 and an intermediate or first search position wherein the bonding tool is in predetermined relation to the work piece but is not in full bonding contact therewith. Movement of the support arm to its first search position is effected by manual control means in the form of the operating handle 36 which is fixedly mounted on a pivot block 60 which is pivotally supported on a transverse pivot shaft 62 suitably supported by the base frame means 12.

A connecting rod 64 is povitally connected at its opposite ends to the pivot block 60 and to a control plate 66 about pivot axes 68 and 70, respectively. The control plate 66, alternatively termed an actuating plate, is pivotally connected to the pivot plate 46 through a transverse pivot axis 72 so as to enable the control plate to lie generally coplanar with the pivot plate 46 but allow pivoting relative to the pivot plate. The control plate 66 is biased to a position generally coplanar with the pivot plate 46 by a pair of compression springs 74a and 74b which are interposed, respectively, between opposite sides of the control plate 66 and associated spring retainer arms 76a and 76b fixed, respectively, to the upper and lower surfaces of the pivot plate 46 so as to overlie and underlie the control plate 66, as illustrated in FIGS. 2 and 3.

The compression springs 74a and 74b are selected so as to maintain the control plate 66 in generally coplanar relation with the pivot plate 46 during initial downward movement of the pivot plate until the head of an adjustable stop screw 78 carried by a support member 80 engages a stop member 82 fixed to an upstanding support 84 on the frame 12. The support member 80 is pivotally mounted on the upstanding plate 50 and is engaged by an adjustable screw 85 (FIG. 2) carried by pivot plate 46 to as to move member 80 downwardly as the pivot plate moves downwardly. Stop screw 78 is adjustable relative to the support member 80 so as to enable selective adjustment of the search position of the bonding tool 28 relative to a work piece supported on the work piece support 18. The operating handle 36 and associated connecting rod 64 and control plate 66 provide first actuator means operatively associated with the support arm 44 to enable manually controlled movement of the support arm from its first raised position to an intermediate or first search position wherein the bonding tool is in predetermined relation to the work piece such as being closely spaced thereto.

As will be described more fully hereinbelow, when the support arm 44 is moved downwardly to its search position wherein the stop screw 78 engages the stop member 82, further downward movement of the operating handle 36 overcomes the biasing spring 74b and moves the control plate 66 downwardly relative to the pivot plate 46 about the pivot axis 72. This further movement of the operating handle and control plate initiates a ramped movement of the bonding tool downward to effect a predetermined progressively increasing contact force between the lower ball end of the conductor wire disposed below the bonding tool and the selected spot on the work piece to which the wire is to be bonded.

To effect ramped movement of the bonding tool, second actuator means in the form of an electrically energizeable actuator solenoid 86, termed the force solenoid, is mounted on pivot plate 46 such that the actuating core piece or plunger 86a extends upwardly through a suitable opening in the pivot plate in generally normal relation thereto. The upper end of the core piece or plunger 86a is fixed to the support 44, as through a screw 88, so that when the solenoid 86 is de-energized, the support arm 44 is maintained in substantially parallel relation to the pivot plate 46. Energizing the solenoid 86 is operative to effect pivotal movement of the support arm 44 about the transverse pivot axis 48 toward the pivot plate 46 and thus move the bonding tool in the direction of the underlying work piece. In accordance with one feature of the present invention, a ramped signal is applied to the solenoid 86 after the bonding tool has been moved to its search position by manually depressing the operating handle 36 so as to effect a predetermined ramp movement of the support arm and associated bonding tool from their first search or intermediate positions to second positions in a manner to establish a predetermined progressively increasing contact force between the contact end of the conductor wire and the core piece to obtain a desired bonding pressure.

A coil compression spring 90 has its opposite ends received within suitable spring pockets in the pivot plate 46 and the support member 80 and serves to bias the pivot plate 46 pivotally upwardly when the operating handle 36 is moved from its lowered position to an upper position returning the control plate 66 to its generally coplanar position with the pivot plate 46. A coil compression spring 92 (FIG. 3) has its opposite ends suitably pocketed between the pivot plate 46 and the support arm 44 and serves to urge the support arm upwardly relative to the pivot plate 46. A cap screw 93 is received through a suitable opening in the support arm 44 and has threaded engagement with the pivot plate 46 to establish an adjustable upper limit of the support arm relative to pivot plate 46.

To initiate application of the ramped energizing signal to the solenoid 86, switch means in the form of a microswitch 94 is mounted on the support arm 80 so that its switch contact actuating arm 94a underlies the control plate 66 and is actuated by an adjustable screw 95 carried by the control plate when the operator moves the operating handle 36 downwardly after the pivot plate 46 has reched its downward limit as established by the search position stop screw 78.

As the support arm 44 and associated bonding tool 28 are moved between their first upper raised positions and their fully downward positions during a bonding operation, the bonding wire, a portion of which is indicated at 96 in FIG. 2, is selectively gripped or clamped between a pair of clamping arms 100a and 100b carried on the support arm 44 so as to incrementally advance the conductor wire to prepare a new exposed end or "tail" of bonding wire after each bond-loop-bond cycle. One of the clamping arms, such as 100b, is fixedly mounted to the support arm 44 and the other clamping arm 100a is pivotally connected to the fixed clamping arm so as to enable pivotal movement therebetween about a pivot axis normal to the longitudinal axis of the support arm 44. As illustrated in FIGS. 2 and 3, a pivot axis transverse to the support arm 44 is established between the clamping arms 100a and 100b by a par of identical size spherical balls 102. The clamping arms 100a, b have gripping or clamping fingers 104a and 104b, respectively, thereon which, in the embodiment of FIGS. 1-4, are urged into normally open positions by a tension spring 106 suitably interconnected between the clamping arms. A wire clamping control solenoid 108 is carried by the clamping arm 100b and has its core piece interconnected to the clamping arm 100a through a spring 109 such that energizing solenoid 108 serves to close the clamping fingers or jaws 104a, b. A stop screw 110 is preferably received in a suitably taped bore in the clamping arm 100a and is adjustable to selectively limit the maximum opening between the clamping fingers 104a, b.

A bonding wire guide tube 114 is supported on a support arm 116 which is fixed to clamping arm 100b so that the lower end of the guide tube 114 substantially axially overlies the capillary bonding 28. The guide tube 114 is adapted to receive the bonding wire from wire supply means 30 and guide the bonding wire to the bonding tool. The clamping fingers 104a, b are positioned between the guide tube and the bonding tool. In the illustrated thermosonic type bonder apparatus 10, an electronic flame-off electrode arm 120 is supported by a pivot block 122 which is pivotally mounted on a support arm 124 to enable selective pivotal movement of the electronic flame-off electrode 120 to a position to spark and heat an advanced tail end of the bonding wire 96 so as to form a ball on the bonding wire preparatory to bonding. The electronic flame-off electrode 120 and its manner of operation are well known in the art and need not be described in greater detail herein.

Referring now to FIGS. 4 and 5, the bonding wire supply means 30 includes an annular spool or reel mount 130 which is fixedly mounted on a support plate 132 as by screws 134. The support plate 132 has a bevelled mounting edge 132a which is fixed to the upstanding support member 84. The support 84 also provides mounting means for the microscope means 22. An annular plate 138 is positioned between the spool mount 130 and the support plate 132 and has a circular outer surface which serves as a guide for a transparent protective cover 140. The spool mount 130 is adapted to receive a bonding wire supply spool 144 thereon on which is wound a continuous length of bonding wire 96. A circular guide plate 146 having a smooth curved outer peripheral surface 146a is mounted on the spool mount 130 so as to retain the bonding supply spool 144 thereon and provide a smooth surface over which the bonding wire is drawn during play-out to the bonding tool 28. The guide plate 146 has an annular externally threaded boss 148 having releasible threaded connection with an internally threaded bore 130a formed axially of the spool mount 130. A tubular wire guide tube 150 is received and supported within axially aligned openings centrally of the guide plate 146, boss 148 and plates 138 and 132 to receive the bonding wire 196 drawn from the supply spool 144. The guide tube 150 is preferably made of glass and has an outwardly flared entry end 150a so as to provide low friction resistance to movement of the bonding wire.

An elongated support arm 154 is suitably secured to the support plate 132 so as to extend therefrom in parallel spaced relation with the axis of the guide tube 150. The support arm 154 supports a tubular wire guide 156 in axial relation with the guide tube 150, the guide 156 preferably being of the same tube size as guide tube 150 and being made of glass. The guide tube 156 receives the bonding wire 96 therethrough and has a drag fiber 158 inserted therein which is adjustable to selectively vary the drag applied to the bonding wire. In accordance with one feature of the present invention, the conductor wire supply means 30 is mounted on the support member 84 so that the center axis of the supply spool or reel 144 and associated guide path defined by the guide tubes 150 and 156 is inclined downwardly from horizontal so that the bonding wire travels down an inclined path toward the bonding tool. In this manner, the inertia of the conductor wire between the supply spool and the guide tube 156 assists in withdrawing the bonding wire from the supply reel. By adjustment of the drag fiber 158, a predetermined axial tension may be maintained in the bonding wire as it approaches the bonding tool 28. Preferably, a wire tension arm 160 is mounted on the support arm 154 in a manner to act against the bonding wire and maintain it in desired tension as it enters the guide tube 114.

Figure 12:
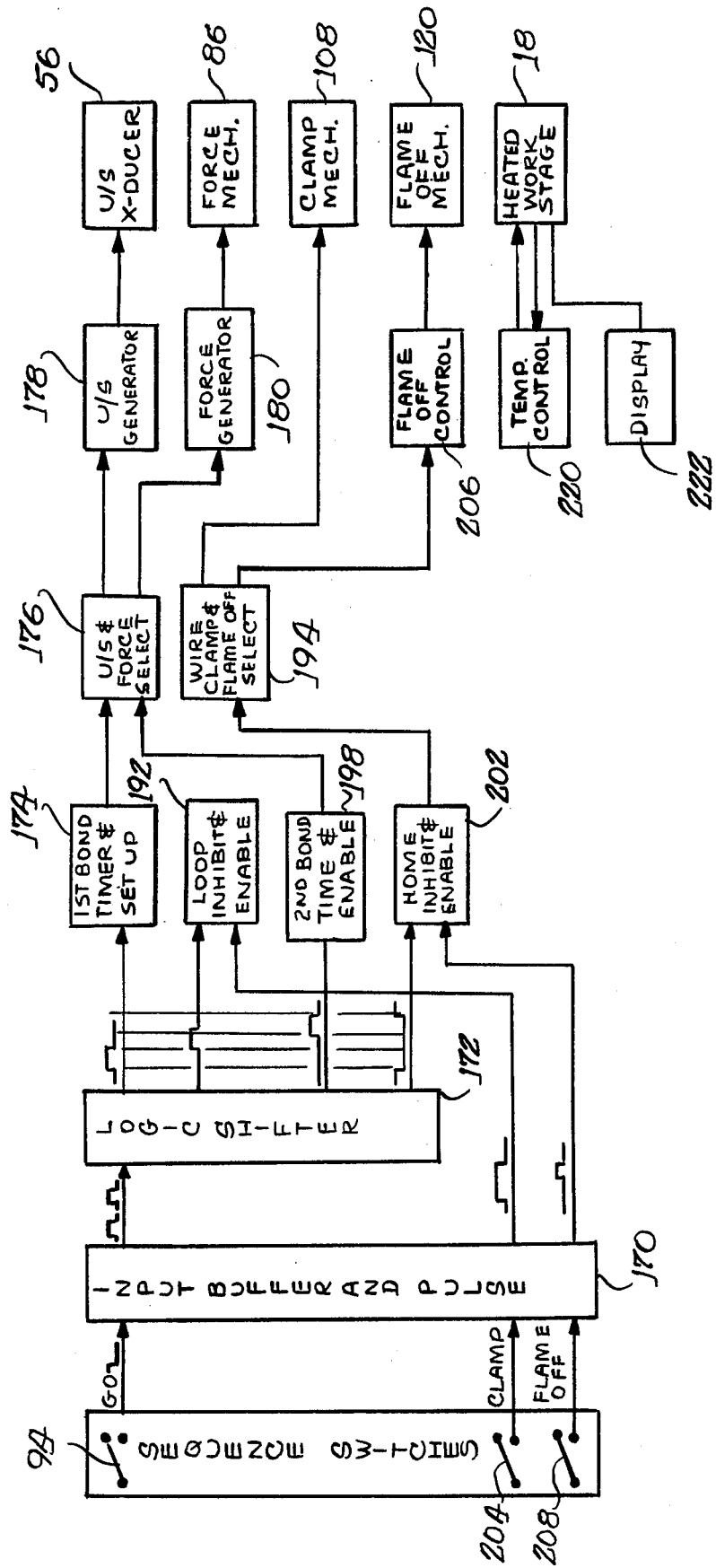
FIG. 12 is a logic diagram of the control circuit for use with the bonder apparatus illustrated in FIGS. 1–3.

The operation of the bonding apparatus 10 thus far described may be best understood with reference to the logic diagram shown in FIG. 12 which represents the logic for the control circuit employed in the bonding apparatus 10. As previously mentioned, when it is desired to make a bond connection of the bonding wire 96 to an underlying work piece, the operator depresses the operating handle 36 to move the bonding tool to its search position which, in the illustrated embodiment, is adjusted to position the bonding tool a predetermined distance above the work piece. The operator may then, if necessary, manipulate the operating handle 38 to more accurately position the work piece relative to the bonding tool. Thereafter, the operator further depresses the operating handle 36 to effect touchdown of the bond ball. This movement moves the control plate 66 pivotally downwardly relative to pivot plate 46 and actuates switch 94 at substantially the point at which the bond ball engages the work piece. Switch 94 is shown schematically as a sequence logic switch 94 in the logic diagram of FIG. 12.

Actuation of switch 94, which serves as the touchdown sensor switch, creates a pulse signal that goes from high to low as touchdown is effected. This pulse signal, termed the "go" signal, is fed into a signal conditioner identified as the input buffer and pulse circuit 170 in the logic of FIG. 12. The input buffer and pulse circuit buffs and pulses the input signal and establishes an output signal to a logic shifter, such as a 4000 series CMOS, which is adapted to provide four output pulse signals Q1, Q2, Q3 and Q4. The first pulse output signal Q1 is thus established at the point of touchdown of the bonding wire ball with the work piece and provides a signal to a first bond timer and set-up circuit 174. The first bond timer 174 applies a signal to an ultrasonic (U/S) and force select circuit 176 which, in turn, is adapted to simultaneously apply signals to an ultrasonic generator circuit 178 and a force generator circuit 180. The ultrasonic generator circuit 178 is adapted to energize the transducer 56 which is operative to effect a scrubbing action of the bond wire ball at the interface with the work piece, as is known.

The force generator 180 is adapted to apply a ramped power signal to the force solenoid 86 so as to apply a predetermined progressively increasing or ramping contact force between the ball on the bonding wire and the underlying work surface. An example of a force generator circuit adapted to provide a ramped power signal to the solenoid 86 is exemplified in the circuit diagram of FIG. 14 on which values for the various components are shown. The voltage applied to the solenoid 86 in a ramped fashion is effected by operational amplifiers with capacitance loading and includes means for selectively adjusting the maximum voltage level through a potentiometer adjustable through a control switch 182 mounted on the front panel 34 of the bonder cabinet 32 as shown in FIG. 1.

The wire clamping fingers 104a, b are normally biased to their open positions and remain open during the first bond. At the end of a predetermined bond time, as established by the first bond timer and set-up circuit 174, the bonding force contact solenoid 86 is de-energized enabling return of the bonding tool to its search or return height by the action of the compression return spring 92. The operator then raises the control arm 36 to raise the bonding tool to a desired loop height and moves the work stage in the direction of the second bond site. Upward movement of the control arm deactivates the force switch 94 to establish pulse signal Q2 from the logic shifter circuit 172. Pulse Q2 is applied to a loop inhibit and enable circuit 192 which applies a signal to a wire clamp and flame-off select circuit 194 to maintain the clamping jaws in relative open positions. The operator then lowers the operating handle 36 to again position the bonding tool at the search level and makes a final positioning of the work piece so that the intended bond spot underlies the bonding tool. When the final adjustment is made the operator further depresses the operating handle 36 to again actuate force switch 94. This applies a signal to the input buffer and pulse circuit 170 which triggers the logic shifter 172 to provide pulse signal Q3 to a second bond timer and enable circuit 198 which, in turn, applies a signal to the ultrasonic and force select circuit 176 to again signal the ultrasonic generator circuit 178 and force generator circuit 182 to form a second bond in similar fashion to the first bond. The duration of the second bond is controlled by an adjustable control knob 200 mounted on the control panel 34 in similar fashion to adjustment of the first bond time. The wire clamping fingers 104a,b remain in open positions during the second bond.

At the conclusion of the second bond, the second timer and enable circuit 198 terminates the signal to the force solenoid 86 to again enable upward movement of support arm 44 relative to pivot plate 46 and return of the bonding tool to a position spaced upwardly from the work piece by the action of compression spring 92. This movement causes a clamping control switch 204 to be actuated to condition the wire clamp and flame-off select circuit 194 for energizing the clamping solenoid 108 so as to close the clamping fingers a predetermined distance above the second bond. Following the second bond, the operator raises control arm 36 to again actuate switch 92 which causes the logic shifter circuit 174 to provide pulse signal Q4 to a home inhibit and enable circuit 202. The home and enable circuit 202 applies a signal to the wire clamp and flame-off select circuit 194 which has now been conditioned to energize the clamping solenoid 108 so that raising of the control arm 36 severs the bonding wire above the second bond connection and establishes a new bond wire tail end for connection to the work piece during the next bonding cycle. Raising the control arm 36 also actuates a flame-off control switch 203 which is mounted on support member 80 and has a switch contact 203a actuated by an adjustable screw carried on the control plate 66 in similar fashion to switch 94. Actuation of the flame-off switch conditions a flame-off control circuit 206 through home enable circuit 202 and flame-off select circuit 194 so as to energize a flame-off mechanism operative to actuate the flame-off electrode 120 and form a ball for the new tail end.

To facilitate selective control of the time duration of the first and second bonds and the energy level applied to the ultrasonic transducer 56 during each bond, time control actuating knobs 212a, and 212b and ultrasonic energy level control knobs 214a and 214b are mounted on the control panel 34 for operator access. The control knobs 212a,b and 214a,b provide potentiometer control of their respective control circuits as is known. Preferably, a main power switch 216, an electric flame-off power control switch 218, a work stage temperature control knob 220, an L.E.D. work stage temperature set point indicator 222, work stage temperature test switch 224, ultrasonic power meter 226 and ultrasonic generator test switch 228 are mounted on the control panel 34 to facilitate operator testing, and control L.E.D. signals 230a and 230b indicate energizing during the first and second bonds, respectively.

In accordance with one feature of the present invention, means are provided to produce an audio signal at the beginning of a bond cycle on touchdown of the bonding head, and also provide an audio signal indicating the end of a bond cycle. The audio signal means may comprise a conventional piezo electric type audio means or any suitable noise producing means operatively coupled to the ultrasonic transducer 56 so as to be energized and de-energized in response to a change in amplitude of the ultrasonic transducer arm during touchdown and release of weld head from the work piece.

FIGS. 6–9 illustrate a bonding head, indicated generally at 240, constructed in accordance with another embodiment of the present invention. As will become more apparent hereinbelow, the bonding head 240 finds particular application with relatively small diameter bonding wire, such as 5–12 microns, thus lending itself for use in making interconnects within the boundary of a single microelectronic chip or wafer. The structural elements of the bonding head 240 and their particular geometry enable the provision of a small size relatively low profile bonding head enabling it to be readily attached as a modular unit to an analytic probe device as employed in the design, development and testing of semiconductor chips having high circuit density.

Very generally, the bonding head 240 includes a base, indicated generally at 242, on which is pivotally mounted a pivot plate, indicated generally at 244, which pivotally supports a support arm, indicated generally at 246. The support arm 246 carries a wedge type bonding tool 248 and a pair of clamping arms 250a and 250b. The support arm 246 defines a longitudinal axis along its major length and is pivotally mounted on the pivot plate 244 for pivotal movement about a pivot axis transverse to the longitudinal axis of the support arm. The pivot plate 244 is pivotally mounted on the base 242 for pivotal movement about a pivot axis transverse to the longitudinal axis of the support arm, thus enabling the support arm to undergo independent pivotal movement relative to the pivot plate 244 and also undergo pivotal movement with the pivot plate about the pivot axis defined between the pivot plate and the base plate.

The base plate 242 comprises a composite base plate having a lower plate 242a, an intermediate plate 242b and an upper plate 242c which are cooperative in a manner to enable rectilinear movement of the support arm 246 in both the "X" and "Y" axes, as considered in a horizontal plane when the base is mounted on a horizontal support surface. The lower base plate 242a has a lower planar support surface 254 which preferably is adapted for releasable attachment to a support surface having a planar reference surface such as on a probe apparatus of the type enabling probing and analysis of microelectronic chips and wafers. To this end, the base plate 242a has a recess 256 formed in its lower surface 254 so that when the base plate is mounted on a planar surface, a substantially closed chamber is established. A vacuum passage (not shown) is provided for communication with the recess 256 and has a suitable fitting 260 enabling connection to a vacuum source so as to enable releasable vacuum attachment of the base on a support surface. Alternatively, one or more magnets (not shown) may be mounted within the lower base surface 254 to provide for a releasable magnetic attachment to a ferromagnetic support surface. As illustrated in FIG. 9, the intermediate plate 242b has a dovetail connection with the lower base plate 242a, and the upper base plate 242c has a dovetail connection with the intermediate base plate. Adjustment means in the form of screw shafts 264 having threaded connection with internally threaded bosses 266 are mounted on the lower and upper base plates 242a and 242c through brackets 268 to facilitate manual adjustable movement between the pairs of base plates 242a,b and 242b,c as by selective rotation of the screw shafts through corresponding control knobs 270. Springs 272 bias the respective base plates to return positions.

The pivot plate 244 is pivotally mounted on the upper base plate 242c through a pair axially aligned pivot pins, one of which is indicated at 274 in FIG. 9. The pivot pins 274 are fixed to the pivot plate 244, as by the illustrated retaining numbers 276, such that conical ends 274a on the pivot pins extend into and are supported by conical recesses formed in bushings 278 which, in turn, are supported within an upstanding support 280 formed on base plate 242c. Pivot plate 244 is urged to an upward pivotable position relative to the base plate 242c by a coil compression spring 284 having its lower end received within a circular recess 286 formed in the base plate 242c and having its upper end received within an annular spring retainer 288 fixed within a circular opening in the pivot plate. A threaded cap 288a is adjustable within the annular retainer 288 to enable adjustment of the upward biasing force applied by the compression spring 284 against the pivot plate 244.

Upward pivotal movement of the pivot plate 244 relative to the base plate 242 is limited and controlled by control means in the form of a cam 290 having a shaft 290a rotatable within a bore 292 formed in a support bracket 294. Bracket 294 is adapted for attachment to the upper surface of base plate 242c so that cam 290 overlies and engages a cylindrical follower 296 supported on the pivot plate 244 by a support screw 298. A control handle 300 is fixed on the end of shaft 298 opposite cam 290 by a connecting member 302 to enable rotation of cam 290 and thereby manually control raising and lowering of pivot plate 244 and support arm 246 against the action of the biasing spring 240. This action serves to manually control both raising and lowering of the bonding tool 248 relative to an underlying work piece.

The support arm 246 is pivotally mounted on pivot plate 244 in similar fashion to the pivotal mounting of pivot plate on base plate 242c. More particularly, support arm 246 is pivotally mounted on and supported by pivot plate 244 through a pair of axially aligned pivot pins 274′ secured to the pivot plate 244 through support members 276′ such that conical ends on the pivot pins 274′ have pivotal relation with corresponding bushings 278′ received in suitable bores, one of which is indicated at 308 in FIG. 9, formed in a transverse arm portion 310 of support arm 246.

A plate member 312 is mounted on the transverse arm portion 310 of support arm 246 so as to extend along the longitudinal axis of the support arm and form a part thereof. With the support arm 246 pivotally mounted on pivot plate 244 for pivotal movement about the transverse pivot axis 274′, plate member 312 is spaced above pivot plate 244. A threaded shaft 316 is fixed to pivot plate 244 in normal upstanding relation thereto and extends freely through a suitable opening 318 formed in plate member 312. A compression spring 320 is mounted over shaft 316 between pivot plate 244 and plate member 312, and a similar coil compression spring 322 is mounted over shaft 316 between plate member 312 and an adjustable nut 324 mounted on the upper end of shaft 316. A nut 326 is preferably threaded onto shaft 316 above the plate member 312 and is adjustable to limit upward pivotal movement of plate member 312 under the action of compression spring 320. Compression springs 320 and 322 may have identical spring rates enabling adjustment of nut 324 to effect a counterbalancing action on the support arm 246 so that its weight is nullified as a component in the contact force applied by the bonding tool 248 during a bonding operation.

The clamping arms 250a and 250b each have clamping means thereon in the form of a clamping or gripping finger 330a and 330b, respectively, which are preferably made of stainless steel and have enlarged diameter arm portions 332a and 332b, respectively, which are mounted within suitable bores 334a and 334b formed in the respective clamping arms 250a,b. The arms 332a,b are of sufficient length to position the clamping or gripping fingers 330a proximate the bonding head 248 which is mounted on the support arm 246 through an ultrasonic transducer 338. The ultrasonic transducer 338 extends through a circular opening 340 in the support arm 246 so that the ultrasonic coil 338a is disposed within a recess 246a in the support arm and has its longitudinal axis coincident with the longitudinal axis of the support arm.

The wedge bonding tool 248 has a cylindrical guide bore (not shown) therefore formed therein to receive and guide a bonding wire 96 so that a tail or contact end of the bonding wire is disposed in underlying relation to a planar bonding surface 248a formed on the foot of the bonding tool. The bonding tool 248 is mounted within a bore in the transducer shaft. In accordance with one feature of the bonding head 240, the bonding tool 248 is angularly inclined relative to a plane transverse to the transducer shaft at an angle of approximately 25° to vertical, considered as the included angle between the longitudinal axis of the bonding tool and the aforementioned vertical plane transverse to the transducer shaft. By so inclining the bonding tool, the bonding head 240 finds particular application with analytical or wire bonder apparatus having microscope viewing means defining a vertical sight path generally normal to a workpiece surface on which a bond wire connection is to be made, the inclined bonding tool enabling the lower end thereof to substantially overlie the intended bonding spot on the work piece without impeding the vertical viewing sight line.

In operation, the bonding head 240 is normally positioned on a generally horizontal support surface on apparatus adapted to support a spool of bonding wire or ribbon which is passed to the bonding head 248 through a suitable passage in the transducer shaft such that the wire moves longitudinally through a generally arcuate path from the supply spool. In accordance with another feature of the bonding head 240, the clamping arms 250a,b cooperate with the support arm 246 in a manner to enable movement of the clamping arms relative to the support arm in planes generally parallel with the longitudinal axis of the support arm while traversing predetermined paths which cause the clamping finger means 330a,b to traverse paths substantially coincident with the predetermined arcuate path traversed by the conductor wire 96 when in guided relation with the bonding tool 248. Specifically, the clamping arms 250a and 250b in the illustrated embodiment are interconnected to the support arm 246 through means which cause the clamping arms to undergo generally arcuate movement in planes generally parallel to the longitudinal axis of the support arm when traversing their aforementioned predetermined paths. The clamping arms 250a,b are interconnected so that movement of one of the clamping arms in a direction generally parallel to the longitudinal axis of the support arm 246 effects a corresponding movement of the other clamping arm. Such interconnecting means includes a pair of identical ball bearings 344 which are received within pairs of mutually opposing semispherical or conical recesses 346a and 346b formed in L-shaped portions 348a and 348b, respectively, of the clamping arms 250a,b. The ball bearings 344 are of sufficient size to maintain the arm portions 348a,b in slightly spaced relation while defining a pivot axis transverse to the longitudinal axis of support arm 246. The clamping arms are maintained in coupled relation with each other by a pair of coil tension springs 350 which are coplanar with balls 344 and have their opposite ends interconnected to the opposed clamping arms through pin connections therewith.

The clamping arm 250a is interconnected to the support arm 246 by means in the form of three bearing balls 352a,b, and c and a screw 354 so as to guide the clamping arms in a predetermined guided path as arm 250a is moved in a plane generally parallel to the longitudinal axis of the support arm. The screw 354 is received through an oversize opening 356 in the pivot arm 250a and has threaded connection with a bore 358 in support arm 246 so that the head of screw 354 retains clamping arm 250a against the balls 350a,b, and c while enabling movement of the clamping arm in its own plane. The balls 350a,b and c are received within suitable elongated slots and formed in the surface of the support arm 246 opposite the clamping arm 250a, such that the elongated slots form arcuate guide tracks in the pivot arm 246 and have their major axes lying generally on a common arcuate segment of a circle the center of which substantially coincides with the center of curvature of the path traversed by the bonding wire 96 as it approaches the bonding tool 248 and is guided therethrough.

A coil tension spring 366 has its opposite ends connected, respectively, to the support arm 246 and the clamping arm 250a, such as through pins 368a and 368b, so that the clamping arms 250a,b are biased to forward positions relative to the pivot arm while being maintained in substantially parallel relation to the support arm 246 during movement. Preferably, the clamping arm 250b is similarly loosely supported on the support arm 246 by a screw 354' received through an oversize opening 356' in the clamping arm 250b, the screw 354' having threaded connection with the support arm but enabling both longitudinal and outward pivotal movement of clamping arm 250b relative to the support arm. In this manner, in addition to the clamping arms being adapted for movement in planes generally parallel to the longitudinal axis of support arm 246, clamping arm 250b may also be pivoted relative to clamping arm 250a so as to enable movement of the clamping or gripping fingers 330a,b between relatively closed positions gripping the bonding wire 96 and open positions releasing the bonding wire.

A pair of parallel positioned electrically energized actuated means in the form of solenoids 372 and 374, which together form incremental wire feeder actuating means, are operatively associated with the clamping arms 250a,b to effect incremental stepped movement of the gripping fingers 330a,b substantially coincident with the path traversed by the bond wire during longitudinal advance or feeding to the bonding head 248. The solenoids 372 and 374 are mounted in parallel relation on a support bracket 376 which in turn is mounted on the pivot plate 244 so that the longitudinal axes of the solenoids 372, 374 lie in a plane containing the arcuate path of movement of the clamping arms 250a,b. Solenoid 372 has a solenoid core 372a the outer end of which is adapted to pivotally connect to one end of a connecting rod 378, the opposite end of which received within an opening 380 in clamping arm 250a so as to provide a lost motion connection between the wire feed solenoid 372 and the clamping arm 250a. The other wire feed solenoid 374 has a core piece 374a which is connected to clamping arm 250a through a connecting rod 382 which does not have lost motion with the clamping arm 250a.

The wire feed solenoids 372 and 374 are connected in a control circuit for the bonding head 240 such that when the clamping arms 250a,b are biased by spring 366 to outward positions relative to support arm 246, energizing the wire feed solenoid 372 operates to move the clamping arms rearwardly a predetermined incremental first distance, whereafter energizing the wire feeder solenoid 374 serves to move the clamping arms rearwardly a second predetermined incremental distance which is generally a shorter distance than the distance effected by energizing solenoid 372. The second incremental movement of clamping arm 250a,b relative to support arm 246 is enabled by the lost motion connection between the feed solenoid 372 and the clamping arm 250a as aforementioned.

Relative pivotal movement between the clamping arms 250a,b to effect gripping and release of the clamping fingers 330a,b, with the bonding wire 96 is effected by clamping actuator means in the form of a clamping solenoid 384 supported by the bracket 376. When energized, the clamping solenoid acts on an end 386 of clamping arm 250b so as to move it against the biasing force of a coil spring 388 which biases the clamping arms 250a,b and thereby the associated clamping fingers 330a,b into normally closed clamping relation.

A bonding force control actuator in the form of a solenoid 390 is mounted on support bracket 376 so that its movable core piece 390a acts upwardly against the lower surface of plate member 312. By applying a ramped power signal to solenoid 390, the support arm 246 is rotated about its pivot axis 274' relative to the pivot plate 244 so as to enable a ramped or progressively increasing bonding force applied by the bonding tool after touchdown with the underlying work piece.

Figure 13:
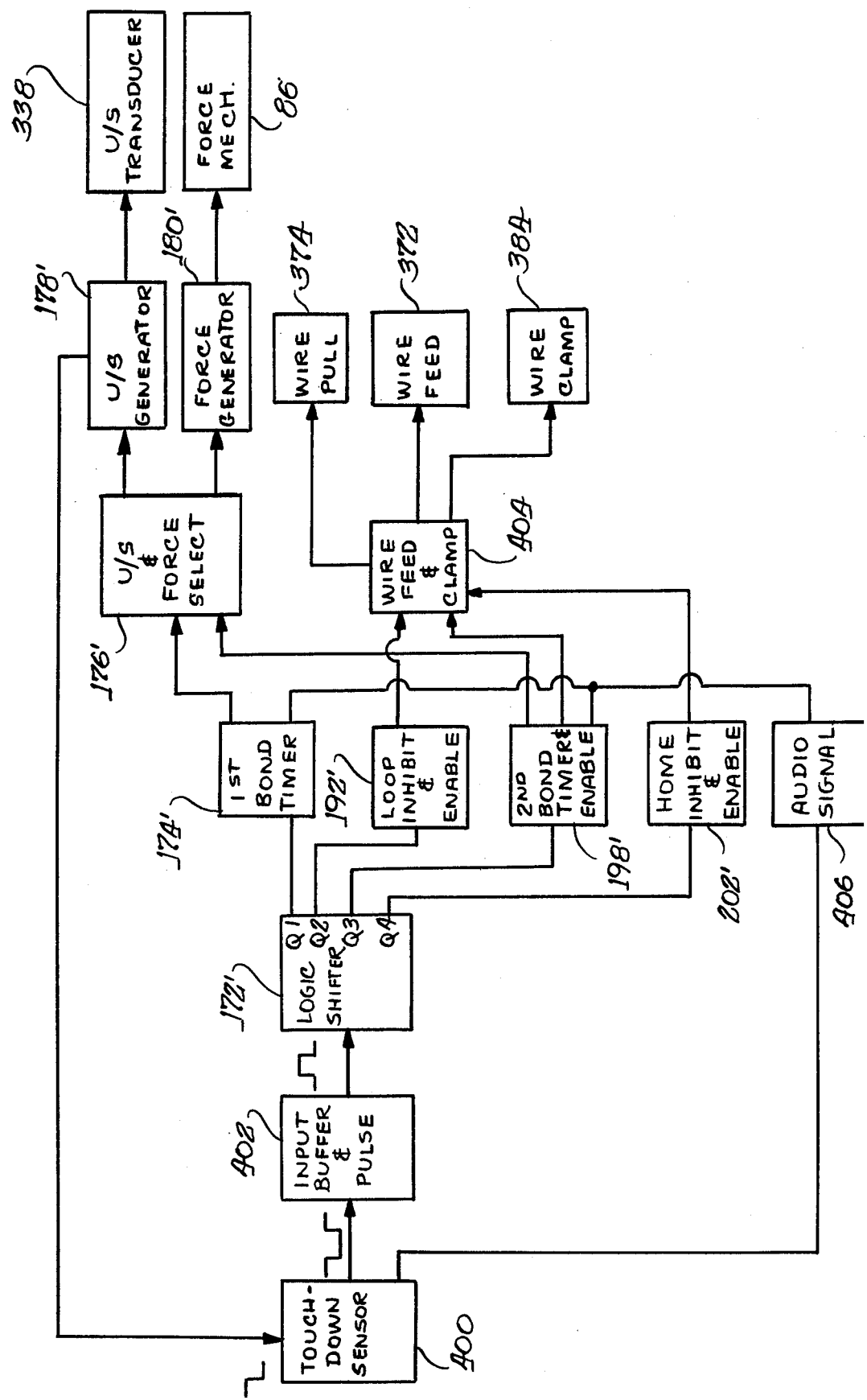
FIG. 13 is a logic diagram for the control circuit employed with the bonding head illustrated in FIGS. 6–9.

The wire feed control solenoids 372 and 374, the wire-clamping solenoid 384 and the force solenoid 390 are connected in an electrical control circuit adapted to carry out operation of the bonding head 240 in accordance with the logic diagram illustrated in FIG. 13. The various circuit elements are of generally conventional design and may be incorporated onto a circuit board placed in a separate portable modular cabinet having a control panel similar to the front control panel 34 employed in the bonding apparatus 10. Alternatively, the control circuit could be integrated into a test or analytical apparatus with which the bonding head 240 might be employed.

In operation, and with reference to the logic diagram for bonding head 240 illustrated in FIG. 13, the operator, after positioning the bonding head so that the bonding tool 248 overlies an adjustable work piece support or pedestal in predetermined height relation, actuates the control handle 300 to lower the support arm 246 and associated bonding tool about the pivot axis 274 so that the bonding surface 248a engages the bonding wire tail or contact end against the work piece, termed the touchdown condition. In accordance with one feature of the bonding head 240, a low level amplitude signal, such as 60K Hertz, is continually applied to the ultrasonic transducer coil 338a when the control circuit is initially connected to its power supply. The control circuit includes a touchdown sensor circuit, indicated at 400 in FIG. 13, adapted to detect the change in amplitude of the transducer upon touchdown and lift off of the bonding tool. The touchdown sensor circuit is shown in FIG. 15.

Upon touchdown, a signal pulse is applied to an input buffer and pulse circuit 402 which applies an output signal to a logic shifter circuit 172'. The logic shifter circuit 172' is substantially identical to the aforedescribed four-phase shift logic shifter 172. Similarly, other circuit components shown schematically in the logic circuit of FIG. 13 and indicated by primed numbers represent circuits that are substantially identical to the corresponding counterparts in the logic circuit described in respect to the bonding apparatus 10. The logic shifter circuit 172' is adapted to provide four output signals Q1, Q2, Q3 and Q4 in a shifted consecutive order upon application of successive input pulses from the input buffer and pulse circuit 402, as is known. The first pulse output signal Q1 is applied at touchdown to a first bond timer circuit 174' which applies a signal to an ultrasonic and force select circuit 176' which in turn applies a predetermined amplitude signal to an ultrasonic generator circuit 178' and applies a signal to a force generator circuit 180'. The ultrasonic generator circuit 178' is operative to energize the ultrasonic transducer 338, while a signal from the force generator circuit 180' is adapted to apply a predetermined timed and ramped power signal to the force actuating solenoid 390 in a manner to establish a predetermined progressively increasing contact force between the bonding tool and the underlying work piece to which a bond connection is to be made. The force generator circuit 180' may be substantially identical to the force generator circuit 180 illustrated in FIG. 14.

At the termination of a predetermined first bond time, as established by the bond timer 174', lift off of the bonding tool causes the touchdown sensor circuit to sense a change in amplitude of the transducer and apply a pulse signal to the logic shifter circuit 172' which applies the second pulse signal Q2 to a loop inhibit and enable circuit 192'. The loop inhibit and enable circuit 192' applies a signal to a wire feed and clamp circuit 404 which energizes the clamping solenoid 384 and opens the wire gripping or clamping fingers 330a,b to release the bonding wire 96. This enables the operator to move the work piece to a second position for making a second bond, the bonding wire being looped between the first and second bond connections. At this time the wire feed and clamp circuit 404 also applies a signal to the wire feed solenoid 372 which is operative to move the clamping arms 250a,b and associated gripping fingers 330a,b a first incremental distance relative to the bonding wire along the aforedescribed predetermined path established by the elongated track grooves 360a,b.

With the work piece positioned for a second bond connection, the operator again actuates the control handle 300 to move the bonding tool to a touchdown position which triggers pulse Q3 from the logic shifter circuit 172'. Pulse Q3 is applied to a second bond timer and enable circuit 198' from which a signal is applied to the ultrasonic and force select circuit 176' and to the wire feed and clamp circuit 404. The signal to the ultrasonic and force select circuit 76' is operative to apply a second predetermined amplitude signal to the ultrasonic transducer 338 and initiate application of a predetermined timed and ramped power signal to the force solenoid 390 in similar fashion to timed application of the first bonding force. The signal applied to the wire feed and clamp circuit 404 is operative to energize the wire clamping solenoid 384 so as to maintain the clamping or gripping fingers 330a,b in relative open positions during looping to the second bond position and during application of the second bond contact force.

At the end of the second bond, as established by the second bond timer and enable circuit 198', the operator again actuates the control handle 300 to raise the bonding tool which effects a pulse signal to the logic shifter 172' by again detecting a change in amplitude of the transducer by the touchdown sensor circuit 400. The logic shifter circuit establishes pulse Q4 which is applied to a home inhibit and enable circuit 202' to in turn signal the wire feed and clamp circuit 404 and terminate the signal to the clamping solenoid 384 allowing the clamping or gripping fingers 330a,b to again grip the bonding wire. Simultaneously, the wire feed and clamp circuit 404 applies a relatively short pulse signal to the feed solenoid 374 to effect a predetermined second incremental or stepped movement of the clamping arm 250a,b sufficient to sever the bonding wire from the second bond. The energizing signals to the solenoids 372 and 374 are electrically timed so as to automatically terminate after the desired tail length is established by energizing solenoid 372 and after the short movement of the closed clamping fingers sufficient to sever the bonding wire from the second bond. Upon de-energizing solenoids 372 and 374, the return spring 366 returns the clamping arms 250a,b to their forward positions to feed the newly established bonding wire connector end or tail to a position underlying the bonding surface 248b.

In accordance with another feature of the present invention, an audio signal circuit of generally known design is provided, as indicated in the logic diagram at 406, which is interconnected to the touchdown sensor circuit 400 and the first and second bond circuits 174' and 198' so as to provide an audio signal at the beginning and end of each bond connection cycle.

It will be appreciated that the bonding head 240 and its associated control circuitry are readily adaptable to automated operation as by connection in a control circuit having capability for moving a work piece support station and the support arm 246 in accordance with a predetermined programmed movement.

FIGS. 10 and 11 illustrate an alternative embodiment of a bonding wire supply arrangement, indicated generally at 410, which is adapted to let off or play out bonding wire from a supply reel or spool in a manner to effect a predetermined axial tension in the corresponding bonding wire as it is fed in a continuous length to an associated bonding tool. The bonding wire supply arrangement 410 includes an electric drive motor 412 which is mounted on a mounting plate 414 such that the longitudinal axis of the motor is disposed substantially normal to the mounting plate 414. The motor 412 is coupled to a suitable speed reducer 416 having an output shaft 416a on which is mounted a reel or spool support hub 418. The support hub 418 is adapted to have a spool or reel of bonding wire 420 mounted thereon so as to effect positive driving rotation of the spool or reel responsive to energizing of the drive motor 412. The drive motor 412 is preferably adapted for incremental rotational movement, such as a suitable stepping motor, in response to successive signals applied thereto. A transparent protective cover 422 is adapted to be mounted on the support plate 414 so as to substantially enclose the spool 420.

A support arm 424 is mounted on the support plate 414 and serves to support a bonding wire guide tube 426 which is preferably made of glass and extends parallel to the support arm 424 with its axis substantially tangent to the annular wire spool 420. A microswitch 428 is mounted on the support arm 424 in a position such that a switch actuating member 428a overlies tension detecting means in the form of a wire member 430 having one end suitably secured to the support arm 424, as by a screw 432, so that the opposite end of the tension detecting wire 430 extends forwardly from the exit end of the guide tube 426 for engagement with the bonding wire as it is withdrawn from the guide tube 426. The mounting plate 412 is adapted for mounting on a bonding apparatus, such as the aforedescribed upstanding support member 84 of the bonding apparatus 10, so that the support arm 424 extends in a downward inclined direction toward the associated bonding tool.

The microswitch 428 is connected in a control circuit to the electric motor 412 and is cooperative with the tension sensing wire 430 such that if the tension in the bonding wire fed from the spool 420 and passed over the loop lower end of the tension sensing wire is subjected to a predetermined tension, the microswitch 428 is energized to incrementally rotate the spool 420 to let off bonding wire until the tension has been reduced to a predetermined desired maximum tension at which time the microswitch 428 is again actuated to terminate the energizing signal to the drive motor 412.

FIGS. 16 and 17 illustrate an alternative embodiment of clamping arms, indicated at 440 and 442, which are adapted to be mounted on a support arm, such as the support arm 44 in the wire bonder apparatus 10, and which are particularly adapted for use in wedge type bonding to enable incremental stepped movement of corresponding clamping fingers to facilitate incremental feeding of the bonding wire to an associated bonding tool and also facilitate severing of the bonding wire after making a second bond. To this end, the clamping arm 440 has inclined coplanar surfaces 440a formed on its forward end to facilitate mounting of a pair of wire clamping fingers 444 and 446 which are pivoted to each other about a pivot axis 448 and are biased to relatively closed positions by an adjustable coil spring 450. The clamping arm 440 has a leg portion 440b which supports a clamping solenoid 452 operative through a control arm 454 to open the clamping fingers 444 and 446.

The clamping arm 442 is fixed to the associated support arm, such as indicated at 45' in FIG. 17, through mounting screws 456a,b and carries the clamping arm 440 through a slide block 460 and a support screw 462, the screw 462 being received through a suitable opening in the clamping arm 440 which enables relative longitudinal movement between the clamping arms. The clamping arm 442 supports a pair of wire feeder solenoids 464 and 466 in axially aligned relation with the core piece 464a of solenoid 464 being connected to the core piece 466a of solenoid 466. The solenoid core piece 466a has an opposite end 466b which is coupled to a second leg portion 440c of the clamping arm 440. A coil tension spring 468 is interconnected between the clamping arms 440 and 442 so as to urge the clamping arm 440 to a forward position relative to the fixedly mounted clamping arm 442.

In the operation of a wire bonder employing the clamping arms 440 and 442 in a wedge bonding, energizing solenoid 464 after a first bond will serve to effect predetermined incremental movement of the clamping arm 440, and thus the clamping fingers 444 and 446, through movement of the solenoid core piece 464a acting on the leg 440c through core piece 466a of solenoid coil 466, this action being undertaken with the clamping fingers 444 and 446 in relative open positions. At the conclusion of a second bond, energizing the solenoid 466 with the solenoid 464 de-energized will cause the core piece 466a to advance a second predetermined incremental distance and effect a second incremental or stepped movement of the clamping arm 440 and associated clamping fingers. This latter movement is of short duration and is effected with the clamping fingers 444 and 446 closed so as to sever the bonding wire from the second bond connection preparatory to the next bond cycle.

While preferred embodiments of the present invention have been illustrated and described, it will be understood that changes and modifications may be made therein without departing from the invention in its broader aspects. Various features of the invention are defined in the following claims.

What is claimed is:

1. A small movable bonder apparatus for releasable attachment to a support surface associated with a microscope to bond a conductive wire to a conductive element on a workpiece, said apparatus comprising:

a base having a substantially horizontal lower side for placement of the apparatus at various locations on the support surface and relative to the microscope, a support arm pivotally mounted on the base for swinging movement between upper release position and a lowered bonding position, a bonding tool on the outer free end of the pivotally mounted support arm for bonding the wire to the conductive element, manually operable means to actuate the support arm and to swing the arm and the bonding tool to a touchdown position in which the bonding tool touches the wire to the conductive element, electrically operated actuator means to provide an increasing contact force between the wire and the conductive element as the bonding tool bonds the wire to the conductive element, wire supply means on the base for feeding the conductive wire to the bonding tool, and means for releasable attaching the base to the support surface to hold the base at a predetermined location with respect to the line of sight of the microscope during the bonding operation, said releasable means allowing movement of the base to various locations on the support surface.

2. A bonding apparatus in accordance with claim 1 in which said releasable attaching means comprises magnetic means having a magnetic attraction between the base and the support surface.

3. A bonding apparatus in accordance with claim 1 in said releasable attaching means comprises a vacuum means for establishing a vacuum between the base and the support surface.

4. A bonder apparatus in accordance with claim 1 in which the bonding tool is inclined an angle of about 25 to the vertical and inclined to the line of sight of the microscope to allow viewing of bonding operation at a lower end of the bonding tool.

5. A bonder apparatus in accordance with claim 1 in which said base comprises upper and lower plates mounted for rectilinear movement respectively along X and Y axes, and means for shifting the respective plates along said axes to position the bonding tool at a desired location on the workpiece.

* * * * *